(12) United States Patent
Choi

(10) Patent No.: US 7,771,892 B2
(45) Date of Patent: Aug. 10, 2010

(54) DOUBLE EXPOSURE METHOD AND PHOTOMASK FOR SAME

(75) Inventor: Jae Seung Choi, Gyunggi-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 591 days.

(21) Appl. No.: 11/321,841

(22) Filed: Dec. 28, 2005

(65) Prior Publication Data

US 2007/0003841 A1     Jan. 4, 2007

(30) Foreign Application Priority Data

Jun. 29, 2005    (KR) ...................... 10-2005-0057360

(51) Int. Cl.
*G03F 1/00*         (2006.01)
*H01L 21/027*    (2006.01)
(52) U.S. Cl. ........................... 430/5; 430/311; 430/394
(58) Field of Classification Search ........................ None
See application file for complete search history.

(56) References Cited

U.S. PATENT DOCUMENTS

| | | | | |
|---|---|---|---|---|
| 6,004,699 | A | * | 12/1999 | Yasuzato et al. ................ 430/5 |
| 6,541,182 | B1 | | 4/2003 | Dogue et al. |
| 6,611,316 | B2 | | 8/2003 | Sewell |
| 2003/0123039 | A1 | * | 7/2003 | Yen et al. ....................... 355/68 |

* cited by examiner

*Primary Examiner*—Daborah Chacko Davis
(74) *Attorney, Agent, or Firm*—Townsend and Townsend and Crew LLP

(57) ABSTRACT

A double exposure method forms first and second patterns on a cell region and a peripheral circuit region of a wafer, respectively. The method comprises performing a primary exposure through two-beam imaging of 0 order light and −1 order light or +1 order light using a photomask to form the first pattern, and performing a secondary exposure through three-beam imaging of the 0 order light and ±1 order light using the photomask to form the second pattern. Since the double exposure method is performed using the single photomask together with different illuminating systems, exposure time and the number of exposures are both decreased, thereby simplifying the overall process of manufacturing a semiconductor device.

7 Claims, 5 Drawing Sheets

US 7,771,892 B2

DOUBLE EXPOSURE METHOD AND PHOTOMASK FOR SAME

CROSS REFERENCE TO RELATED APPLICATIONS

The present application claims priority of Korean Patent Application No. 10-2005-0057360, filed Jun. 29, 2005 and is incorporated by reference.

BACKGROUND OF THE INVENTION

The present invention relates to an exposure method in lithography process for manufacturing a semiconductor device, and a photomask for the same. More particularly, the present invention relates to a double exposure method for manufacturing a semiconductor device, and a photomask for the same.

Generally, semiconductor devices such as Dynamic Random Access Memory (DRAM) comprise a number of fine patterns, which are formed using a photolithography process. To form the fine patterns through photolithography process, a photoresist layer is first deposited on an object layer. The patterned photoresist layer is subjected to an exposure step to selectively change a solubility of portions of the photoresist layer. Then, a developing process is performed to remove portions of the photoresist layer depending on the solubility of the photoresist upon exposure, thereby forming a photoresist layer pattern through which some portion of the object layer is exposed. Thereafter, the exposed portion of the object layer is removed by an etching process using the photoresist layer pattern as an etching mask The photoresist layer is then stripped off, forming an object layer pattern.

Resolution and depth of focus (DOF) are two defining characteristics of a photolithography process. The resolution R can be obtained by the following equation;

$$R = K1 \cdot \lambda / NA \qquad (1)$$

where κ1 is a constant determined by composition and thickness of the photoresist layer, λ is wavelength of light used, and NA indicates the numerical aperture of an illuminating system.

Referring to Equation 1, the resolution R can be increased by decreasing the wavelength of light λ, and/or by increasing the numerical aperture NA, thereby forming a finer pattern. However, there are limitations in such an approach when degree of device integration is rapidly increased. Accordingly, to overcome the limitations as described above, various resolution enhancement techniques (RETs) for enhancing resolution and depth of focus have been proposed. For example, optical proximity correction, phase shift mask, off-axis illuminating system, and the like have been used as one or more of the RETs. A double exposure technique has also been used to form very fine patterns on a wafer.

FIG. 1 is a layout view illustrating an example of a pattern suitable for a conventional double exposure method. Referring to FIG. 1, a wafer 100 comprises a cell region 110 in which dense patterns 130 are formed, and a peripheral circuit region 120 in which an isolated pattern 140 is formed. Alternatively, the dense patterns 130 can be formed in the peripheral circuit region 120 instead of the cell region 110. Although the isolated pattern 140 is shown as a line or a stripe in FIG. 1, it can have other shapes. In addition, the patterns formed on the cell region 110 are disposed in one direction, whereas the pattern formed on the peripheral circuit region 120 can be disposed in more than one different directions.

FIGS. 2 to 5 are simplified diagrams illustrating a conventional double exposure method for forming the pattern in FIG. 1.

Referring to FIGS. 2 and 3, a primary exposure is performed using a first photomask 200 and a first illuminating system 300. The first photomask 200 has a first region 210 and a second region 220 corresponding to the cell region 110 and the peripheral circuit region 120 on wafer 100 respectively. The first region 210 has a first pattern 230 corresponding to the dense and fine patterns 130 to be formed on the cell region 110 on wafer 100. The second region 220 is provided with a photo-shielding layer 240 to cover an entire surface of the second region 220. The first illuminating system 300 is a dipole modified illuminating system suitable to form the dense and fine pattern 130 oriented in one direction in the cell region 110. When the primary exposure is performed using the first photomask 200 and the first illuminating system 300, the dense pattern 130 in the cell region 110 are exposed to light, while the isolated pattern 140 in the peripheral circuit region 120 is not exposed to the light.

Next, referring to FIGS. 4 and 5, a secondary exposure is performed using a second photomask 400 and a second illuminating system 500. The second photomask 400 has a first region 410 and a second region 420 corresponding to the cell region 110 and the peripheral circuit region 120 on wafer 100 respectively. The first region 410 is provided with a photo-shielding layer 430 to cover the entire surface of the first region 410. The second region 420 has a second pattern 440 corresponding to the isolated pattern 120 to be formed on the peripheral circuit region 120 of wafer 100. The second illuminating system 500 is an annular modified illuminating system, suitable to form the isolated pattern 140 having a higher pitch and disposed in more than one directions as in the peripheral circuit region 120. When the secondary exposure is performed using the second photomask 400 and the second illuminating system 500, the isolated pattern 140 of the peripheral circuit region 120 is exposed to light, whereas the dense and fine pattern 130 in the cell region 110 are not exposed to the light.

In the conventional double exposure method, the first photomask 200 and the first illuminating system 300 are used to form the pattern in the cell region 110, and the second photomask 400 and the second illuminating system 500 are used to form the pattern in the peripheral circuit region 120, thereby allowing the dense and fine patterns 130 and the isolated pattern 140 to be formed at an excellent resolution on the cell region 110 and the peripheral circuit region 120, respectively. However, since it is necessary to provide the first photomask 200 for the primary exposure and the second photomask 400 for the secondary exposure, manufacturing costs are increased. In addition, changing of the photomasks between primary and secondary exposures complicates the overall process of manufacturing semiconductor devices and increases manufacturing time.

BRIEF SUMMARY OF THE INVENTION

According to present invention, techniques for processing integrated circuit devices are provided. In particular, the present invention provides a double exposure method and a photomask for fabricating semiconductor devices for lithography process. The invention can be applied to a variety of devices such as dynamic random access memory device, static random access memory device, application specific integrated circuits, flash memory devices, and others.

In accordance with one aspect of the present invention, a double exposure method for forming a first pattern in a cell region of a wafer and a second pattern in a peripheral circuit region of a wafer is provided. The double exposure method includes performing a primary exposure using a photomask and two-beam imaging to form the first pattern. The two beam imaging uses a zero order light and a +1 order light, or a zero order light and a −1 order light in a specific embodiment. The double exposure method also includes performing a secondary exposure using the same photomask and three-beam imaging to form the second pattern. The three beam imaging uses the zero order light, the +1 order light, and the −1 order light in a specific embodiment.

In a preferred embodiment, the photomask comprises a first region allowing a first pattern to be transferred onto the cell region using two-beam imaging, and a second region allowing a second pattern to be transferred onto a peripheral circuit region using three beam imaging. Preferably, the photomask comprises a halftone phase shift mask disposed on the first region, and an alternating phase shift mask disposed on the second region.

Preferably, the primary exposure is performed using a modified illuminating system as a light source and the secondary exposure is performed using a general illuminating system as a light source. In a specific embodiment, the modified illuminating system is a dipole illuminating system.

In certain embodiment, the first pattern comprises dense patterns, and the second pattern comprises an isolated pattern having a higher pitch than the first pattern.

In accordance with another aspect of the present invention, a double exposure method for forming a first pattern in a cell region and a second pattern in a peripheral circuit region of a wafer, is provided The method includes performing a primary exposure using a modified illuminating system as a light source and a photomask. The photomask comprises a halftone phase shift mask to form the first pattern in the cell region. The method also includes performing a secondary exposure using an alternating phase shift mask and a general illuminating system to form the second pattern in the peripheral circuit region.

In accordance with yet another aspect of the present invention, there is provided a photomask for a double exposure method in lithography process. The method includes a primary exposure using a modified illuminating system, and a secondary exposure using a general illuminating system to form a first pattern in a cell region and a second pattern in a peripheral circuit region on a semiconductor wafer. The photomask comprises a substrate having a first region and a second region, corresponding to the cell region and the peripheral circuit region on the semiconductor wafer respectively. A first halftone layer pattern is disposed on the first region of the substrate and a second halftone layer pattern is disposed in the second region of the substrate. A phase shift layer pattern is disposed adjacent to the second halftone layer pattern in the second region of the substrate. Preferably, the first halftone layer pattern comprises a material having a transmittance of 0~50%. In a specific embodiment, the phase shift layer pattern has a trench shape formed by etching the substrate to a predetermined depth. The trench-shaped phase shift layer pattern comprises a first phase shift layer pattern and a second phase shift layer pattern. The first phase shift layer pattern has a phase difference of 180 degrees with respect to the second halftone layer pattern and disposed adjacent to the second halftone layer pattern. The second phase shift layer pattern has a phase difference of 45~135 degrees with respect to the first halftone layer pattern and disposed to surround the first halftone layer pattern. In a preferred embodiment, the second phase shift layer pattern has a phase difference of 90 degrees with respect to the first phase shift layer pattern.

In certain embodiment, the photomask may further comprise a light shielding layer pattern disposed on the second halftone layer pattern.

Preferably, the first pattern comprises a dense patterns and the second pattern comprises an isolated pattern having a higher pitch than the first pattern.

DETAILED DESCRIPTION OF THE INVENTION

Preferred embodiments of the present invention will be described in detail with reference to the accompanying drawings. It should be noted that the embodiments can take a variety of forms, and that the present invention is not limited to the embodiments as set forth below.

Figure 1:
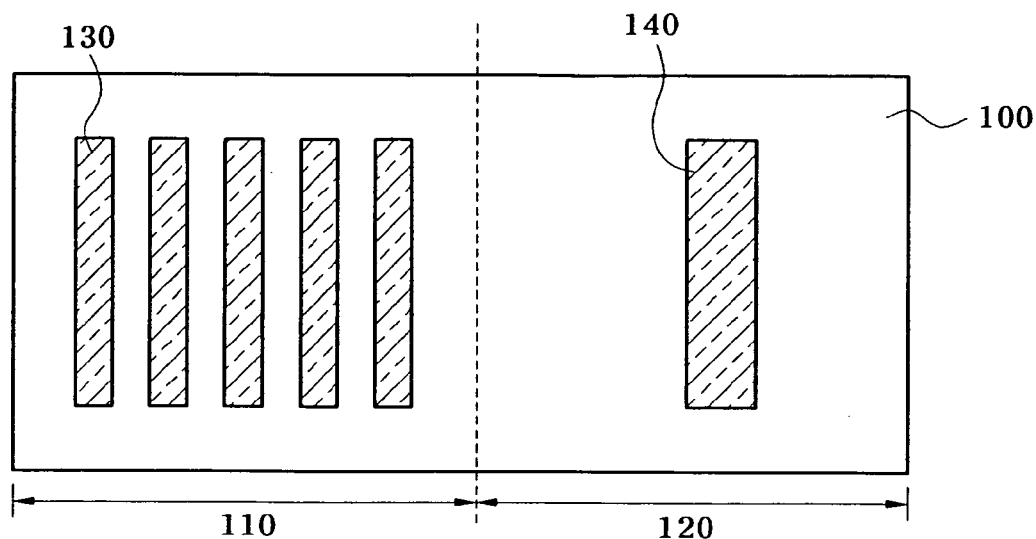
FIG. 1 is a layout view illustrating a pattern suitable for a conventional double exposure method.
Figure 2:
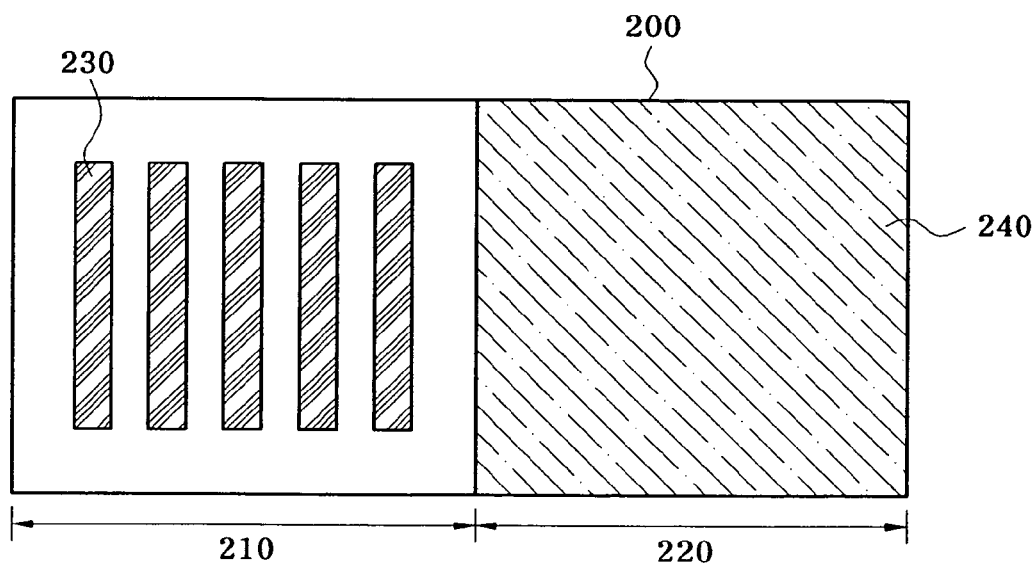
FIGS. 2 to 5 are simplified views illustrating a conventional double exposure method for fabricating a semiconductor device.
Figure 3:
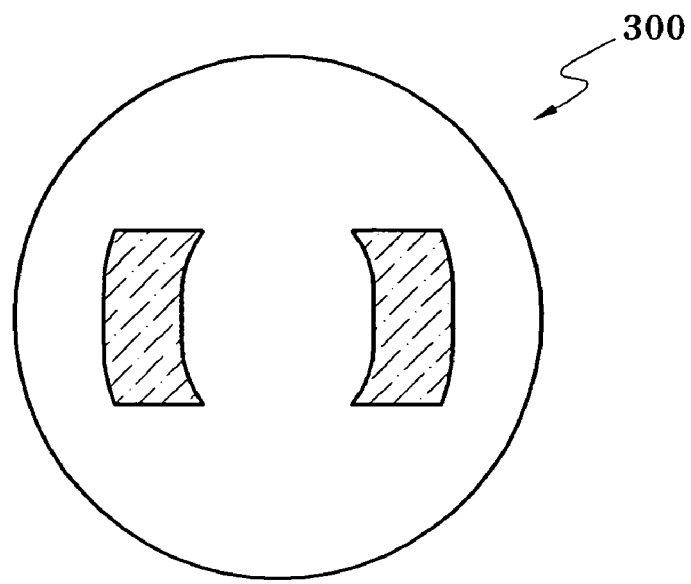
Figure 4:
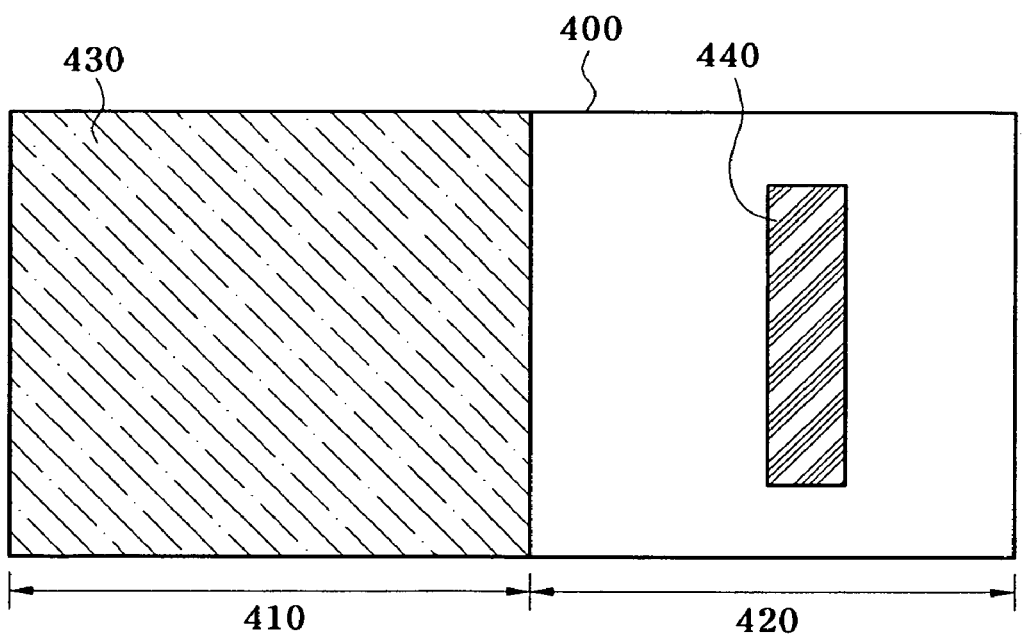
Figure 5:
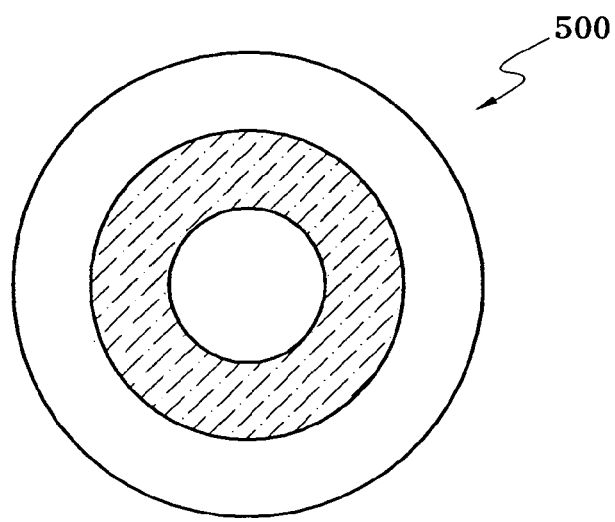
Figure 6:
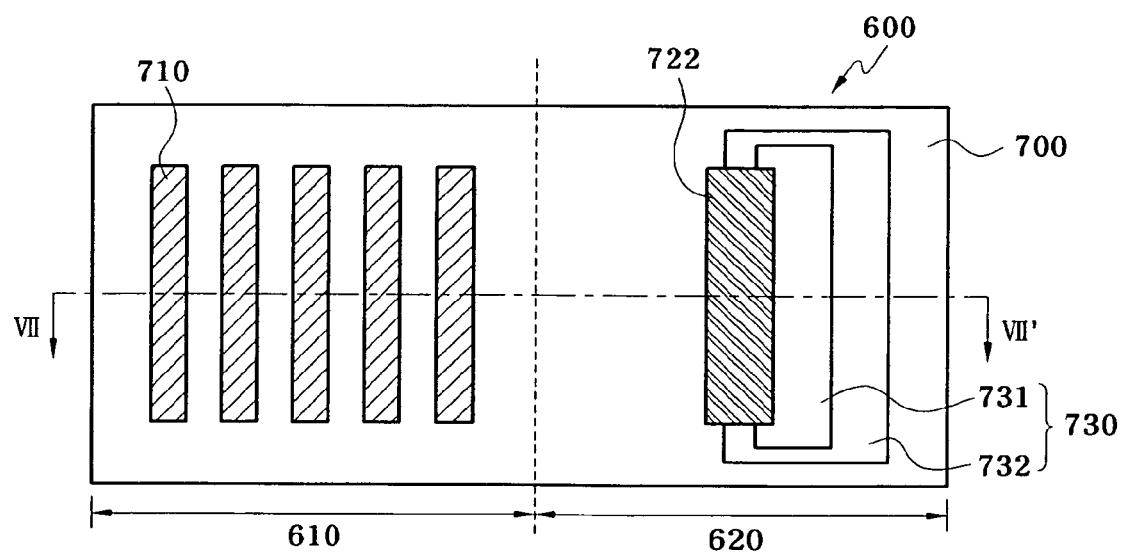
FIG. 6 is a simplified layout view illustrating a photomask used for a double exposure method in accordance with one embodiment of the present invention.
Figure 7:
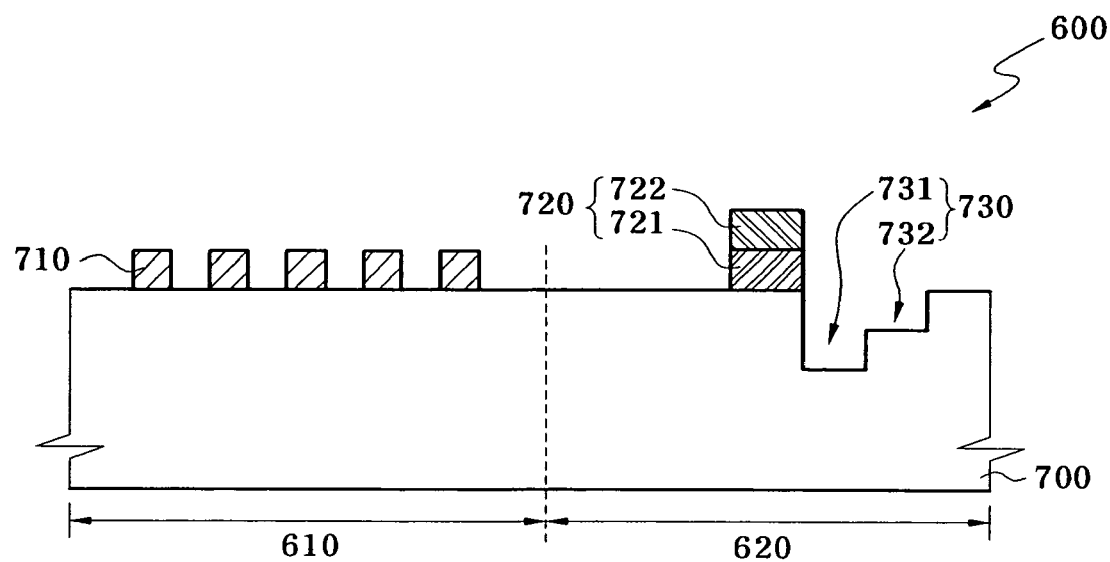
FIG. 7 is a simplified cross sectional view of a photomask in accordance with an embodiment of the present invention.

FIG. 6 is a layout view illustrating a photomask used for a double exposure method in accordance with an embodiment of the present invention FIG. 7 illustrates a cross sectional view taken along VII-VII'.

Referring to FIGS. 6 and 7, photomask 600 comprises a substrate 700. A first pattern is disposed in a first region 610 and a second pattern is disposed in a second region 620 of substrate 700. The first region 610 comprises a halftone phase shift mask while the second region 620 comprises an alternating phase shift mask. In a specific embodiment, the substrate 700 is formed using quartz. Other light transmitting materials may also be used. The first region 610 corresponds to a cell region on a semiconductor wafer, and the second region 620 corresponds to a peripheral circuit region on the semiconductor wafer.

A first halftone layer pattern 710 is formed on the first region 610 of the substrate 700. In certain embodiments, the first region 610 corresponds to a dense pattern such as a cell region on a semiconductor wafer. The dense patterns are disposed in a predetermined direction, and have very low pitch between lines in. The first halftone layer pattern 710 has a light transmittance of about 0~50%. In addition, light transmitted through the first halftone layer pattern 710 has a phase difference of 180 degrees with respect to light transmitted through the substrate 700.

A second pattern 720 is formed in the second region 620 of the substrate 700. The second pattern 720 corresponds to an isolated pattern formed on the peripheral circuit region of the semiconductor wafer. The isolated pattern can be disposed in various directions, and has a higher pitch than the dense patterns. The second pattern 720 has a structure wherein a second halftone layer pattern 721 overlies a light shielding layer 722, e.g., they are sequentially stacked, to form the second pattern 720. The second halftone layer pattern 721 has a light transmittance of about 0~50%. The light shielding layer 722 can be formed using a chrome material to further enhance the contrast of the peripheral circuit region.

Photomask 600 also has a phase shift layer pattern 730 disposed adjacent to the second pattern 720. The phase shift layer pattern 730 has a trench shape formed by etching the substrate 700 to a predetermined depth. The phase shift layer pattern 730 comprises a first phase shift layer pattern 731, and a second phase shift layer pattern 732. The second phase shift layer pattern surrounds the first phase shift layer pattern 731. The first phase shift layer pattern 731 has a phase difference of 180 degrees with respect to the substrate 700. The second phase shift layer pattern 732 has a phase difference of about 45~135 degrees with respect to the first phase shift layer pattern 731, Preferably, the second phase shift layer has a phase difference of 90 degrees with respect to the first phase shift layer pattern. Accordingly, the first phase shift layer pattern 731 is arranged adjacent to the second phase shift layer pattern 732, and have a phase difference of 90 degrees with respect to each other. In addition, the second phase shift layer pattern 732 and the substrate 700 are arranged to have a phase difference of 90 degrees with respect to each other. Such an arrangement prevents an undesired pattern from being transferred onto the wafer due to a phase conflict between adjacent regions having a phase difference of 180 degrees.

Figure 8:
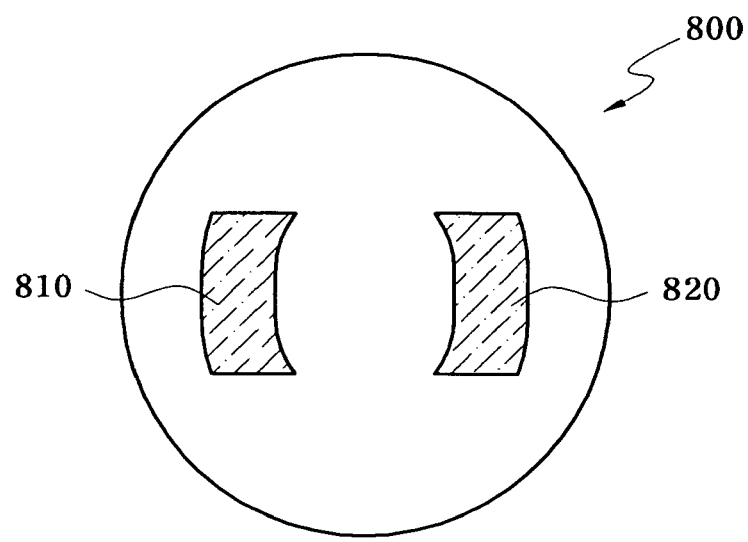
FIGS. 8 and 9 are simplified diagrams illustrating an illuminating system used for an double exposure method in accordance with an embodiment of the present invention.
Figure 9:
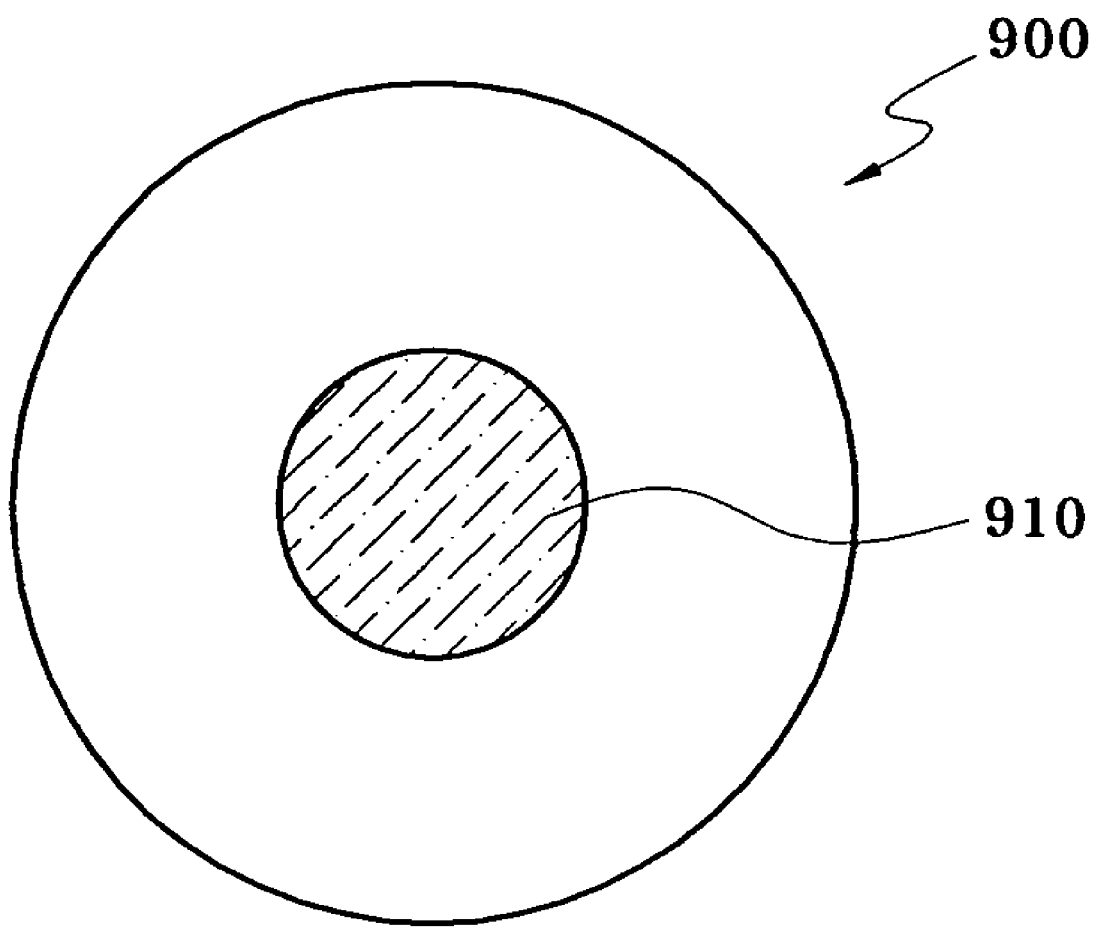

FIGS. 8 and 9 are simplified views illustrating an illuminating system for the double exposure method according to embodiments of the present invention.

As shown in FIG. 8, a dipole modified illuminating system 800 is used for primary exposure in the double exposure method. The dipole modified illuminating system has two numerical apertures 810 and 820 disposed in a dipole shape. With such a dipole modified illuminating system 800, two-beam imaging is performed in such a manner that, among light diffracted by the mask, zero order light and −1 order light or zero order light and +1 order light are allowed to pass through lenses of the system to form an image on the wafer. When the numerical apertures 810 and 820 are disposed in parallel in the dipole modified illuminating system 800, the system provides a high contrast in the vertical direction and a low contrast in the horizontal direction. In particular, when the dipole modified illuminating system 800 for two-beam imaging is used together with a halftone phase shift mask layer, a finer pattern can be obtained.

Next, as shown in FIG. 9, a general illuminating system 900 is used for secondary exposure in the double exposure method according to an embodiment of the present invention. The general illuminating system has a single numerical aperture 910 circularly disposed at the center thereof. With the general illuminating system 900, three-beam imaging is performed in such a manner that among light diffracted by the mask, a zero order light and ±1 order light pass through a lens to form an image on a semiconductor wafer. When the general illuminating system 900 for three-beam imaging is used together with an alternating phase shift mask layer, a finer pattern can be obtained.

A double exposure method for lithography process according to embodiments of present invention will be descried in detail hereinafter.

First, a primary exposure is performed using the photomask 600, and the dipole modified illuminating system 800. Together with an annular modified illuminating system and a quadruple illuminating system, the dipole modified illuminating system 800 is used for two-beam imaging wherein a zero order light and a −1 order light or a zero light and a +1 order light are used for forming an image on a semiconductor wafer, thereby providing excellent 1 order light efficiency in one direction. The dipole modified illuminating system 800 has characteristics in which the depth of focus becomes severely deteriorated for an isolated pattern disposed in a specific direction on the peripheral circuit region of the wafer.

When the dipole modified illuminating system 800 for two-beam imaging is used together with photomask 600. it has excellent exposure properties with respect to the halftone phase shift mask layer disposed on the first region 610 of the photomask 600, and deteriorated exposure properties with respect to the alternating phase shift mask layer disposed on the second region 620 of the photomask 600. Thus, the first halftone layer pattern 710 disposed on the first region 610 of the photomask 600 is effectively transferred onto the wafer due to a higher contrast, whereas the second pattern 720 disposed on the second region 620 of the photomask 600 is not effectively transferred onto the wafer due to a lower contrast.

After the primary exposure, a secondary exposure is performed using the same photomask 600. and the general illuminating system 900. As described above, with the general illuminating system 900, three-beam imaging wherein zero order light and ±1 order light diffracted on the mask pass through the lens to form an image on the wafer. Accordingly, the general illuminating system 900 is suitable for higher pitch pattern on the peripheral circuit region, and is not suitable for a lower pitch pattern on the cell region.

Thus, when the dipole modified illuminating system 900 for three-beam imaging is used together with the photomask 600, it has a deteriorated exposure property with respect to the halftone phase shift mask layer disposed on the first region 610 of the photomask 600, and excellent exposure properties with respect to the alternating phase shift mask layer disposed on the second region 620 of the photomask 600. Thus, the first halftone layer pattern 710 disposed on the first region 610 of the photomask 600 is not effectively transferred onto the wafer due to a lower contrast, whereas the second pattern 720 disposed on the second region 620 of the photomask 600 is effectively transferred onto the wafer due to the higher contrast.

Since the double exposure method is performed using a single photomask with different illuminating systems, number of process steps are reduced thereby improving the overall efficiency for manufacturing semiconductor devices.

It should be understood that the embodiments and the accompanying drawings have been described for illustrative purposes only and that those skilled in the art will appreciate that various modifications, additions, or substitutions may be allowed without departing from the scope and spirit of the invention. The scope of the invention should be interpreted using the accompanying claims.

What is claimed is:

1. A double exposure method for a fabricating a semiconductor integrated circuit, the method comprising:
   providing a cell region and a peripheral circuit region on a substrate;
   performing a primary exposure using a photomask and a modified illuminating system as a light source; and
   performing a secondary exposure using the photomask and a general illuminating system as a light source,
   wherein the photomask comprises a halftone phase shift mask disposed in a first region of a substrate and an alternating phase shift mask disposed in a second region of the substrate, the first region allowing a cell pattern to transfer to the cell region on a semiconductor wafer and the second region allowing a peripheral circuit pattern to transfer to the peripheral circuit region on the semiconductor wafer, wherein the halftone phase shift mask comprises a first halftone layer pattern:

wherein the alternating phase shift mask comprises:
 a second halftone layer pattern,
 a first phase shift layer pattern having a phase difference of 180 degrees with respect to the second halftone layer pattern, wherein the first phase shift pattern is disposed adjacent to the second halftone layer pattern at an opposite side of the first halftone layer pattern, and
 a second phase shift layer pattern having a phase difference of 45-135 degrees with respect to the first phase shift layer pattern, wherein the second phase shift layer pattern is disposed adjacent to the first phase shift layer pattern.

2. A photomask for manufacturing semiconductor integrated circuit device, the photomask comprising:
 a substrate having a first region and a second region, the first region corresponding to a cell region on a semiconductor wafer and the second region corresponding to a peripheral circuit region on the semiconductor wafer;
 a first halftone layer pattern disposed in the first region of the substrate;
 a second halftone layer pattern disposed in the second region of the substrate; and
 a phase shift layer pattern disposed adjacent to the second halftone layer pattern in the second region of the substrate, wherein the phase shift layer pattern comprises:
 a first phase shift layer pattern having a phase difference of 180 degrees with respect to the second halftone layer pattern, wherein the first phase shift layer pattern is disposed adjacent to the second halftone layer pattern at an opposite side of the first halftone layer pattern, and
 a second phase shift layer pattern having a phase difference of 45-135 degrees with respect to the first phase shift layer pattern, wherein the second phase shift layer pattern is disposed adjacent to the first phase shift layer pattern.

3. The photomask according to claim 2, wherein the first halftone layer pattern is fabricated using a material having a light transmittance of 0~50%.

4. The photomask according to claim 2, wherein the phase shift layer pattern has a trench shape formed by etching the substrate to a predetermined depth.

5. The photomask according to claim 2, wherein the second phase shift layer pattern has a phase difference of 90 degrees with respect to the first phase shift layer pattern.

6. The photomask according to claim 2, further comprising a light shielding layer pattern disposed on the second halftone layer pattern.

7. The photomask according to claim 2, wherein the first halftone layer pattern comprises a dense pattern and the second halftone layer pattern comprises an isolated pattern having a higher pitch than the first halftone layer pattern.

* * * * *